United States Patent [19]

Ishida et al.

[11] Patent Number: 4,568,627

[45] Date of Patent: Feb. 4, 1986

[54] FILM FOR CHROMATIC PROOFREADING

[75] Inventors: Tokujiro Ishida; Syuzi Kondo; Keiji Toei, all of Kyoto, Japan

[73] Assignee: Dainippon Screen Seizo Kabushiki Kaisha, Kyoto, Japan

[21] Appl. No.: 511,331

[22] Filed: Jul. 5, 1983

[30] Foreign Application Priority Data

Nov. 11, 1982 [JP] Japan ................................ 57-169841

[51] Int. Cl.$^4$ ................................ G03C 1/52
[52] U.S. Cl. .................... 430/156; 430/502; 430/165; 430/358; 430/22; 430/143; 430/508; 430/365; 430/952
[58] Field of Search ............... 430/502, 156, 165, 358, 430/22, 143, 508, 365, 952

[56] References Cited

U.S. PATENT DOCUMENTS

| | | | |
|---|---|---|---|
| 1,966,412 | 7/1934 | Krieger | 430/502 |
| 2,036,369 | 4/1936 | Simjian | 430/502 |
| 3,291,603 | 12/1966 | Bryan | 430/358 |
| 3,326,682 | 6/1967 | Endermann et al. | 430/358 |
| 4,260,673 | 4/1981 | Krech | 430/166 |
| 4,366,223 | 12/1982 | Larson | 430/358 |
| 4,393,128 | 7/1983 | Shiba et al. | 430/166 |

*Primary Examiner*—Won H. Louie
*Attorney, Agent, or Firm*—Poms, Smith, Lande & Rose

[57] ABSTRACT

Disclosed is a chromatic proofreading film which may be conveniently used for the process of ascertaining the color quality in multi-color printing by overlaying color picture images produced from the corresponding color separated picture images. The chromatic proofreading film of this invention has two photosensitive layers, the outer one consisting of a silver halide photosensitive material and the inner one consisting of a non silver salt photosensitive material such as diazo or azide resin, and the inner photosensitive layer is divided into a plurality of regions dyed to different basic colors so that the chromatic proofreading film may be cut apart into a plurality of separate sheets which may be overlaid for the purpose of chromatic proofreading after the film is photographically developed.

5 Claims, 5 Drawing Figures

FILM FOR CHROMATIC PROOFREADING

This invention relates to a film for chromatic proofreading and in particular to a film for chromatic proofreading which allows a plurality of films for different colors to be prepared as a process of preparing only one sheet of film.

In the field of multi-color printing, it is necessary to ascertain the color quality of a printed material before the printing plates of various colors for the printed material are actually prepared. In the so-called overlay method, a plurality of photographic positive picture images are obtained on transparent sheets from corresponding color separated picture images and these sheets are laid one over the other so that the viewer can ascertain the color quality of the multi-color picture image which may be reproduced from the particular color separated picture images. Such a process is sometimes called as chromatic proofreading because of its similarity to the well-known process of proofreading in printing documents and books.

In carrying out such a method, a contact exposure device is often used to print a desired color separated photographic picture images on each film for chromatic proofreading. Alternatively, it is possible to use a chromatic proofreading film comprising two layers of photosensitive material whose upper layer is a silver halide photosensitive layer having a greater photosensitivity than the lower layer which may be comprised of diazo or azide photosensitive layer. By mounting such chromatic proofreading films onto a recording drum of a color scanner one by one for recording each color separate picture image on a separate film, it is possible to obtain, for instance, four sheets of chromatic proofreading film for the basic colors of cyan, magenta, yellow and black, respectively.

Recently, a color scanner which is capable of recording color separation photographic picture images of two or more colors along the circumferential direction for each revolution of the recording drum has come to be available from Dainippon Screen Seizo Kabushiki Kaisha of Kyoto, Japan, and with such a color scanner it is possible to record a plurality of chromatic proofreading films in a time series or substantially at the same time. The inventors recognized that it would be highly convenient if such a color scanner is used for photographically exposing chromatic proofreading films of several colors all at the same time in a very short time period.

However, since chromatic proofreading films of this kind are generally dyed from the start to one of the four colors of cyan, magenta, yellow and black, determining the colors of the color separated picture images that are to be photographically exposed, it is highly inconvenient to mount four sheets of chromatic proofreading film in appropriate places of a recording drum of a color scanner fully taking into account the dimensions of the effective area of the recording drum after cutting chromatic proofreading films of different colors into appropriate sizes and connecting them together with, for instance, with adhesive tape, with proper arrangement. This has to be done strictly manually and requires much time and labor.

In view of such inconveniences in the conventional chromatic proofreading films, a primary object of this invention is to provide a chromatic proofreading film which is free from the above-described inconveniences.

According to this invention such an object is accomplished by providing a chromatic proofreading, comprising a transparent or opaque base film, a non silver salt photosensitive layer consisting of two or more regions placed over the base film, and a silver halide photosensitive layer provided over the non silver halide photosensitive layer.

Now this invention is described in the following with reference to the accompanying drawings, in which:

FIG. 1 shows an embodiment of this invention and this chromatic proofreading film 1 is divided into four regions onto which the color separated picture images of cyan, magenta, yellow and black colors are to be printed correspondingly. The two-dot chain dot line denotes the boundary between different ones of these four regions.

Figure 1:
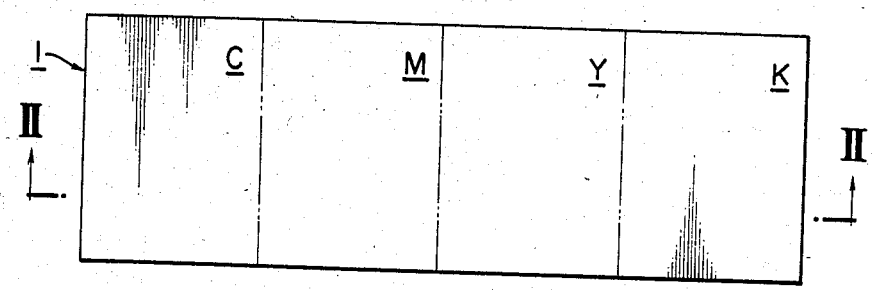
FIG. 1 is a plan view of a chromatic proofreading film according to this invention in which the regions of different colors are arranged in row.
Figure 2:
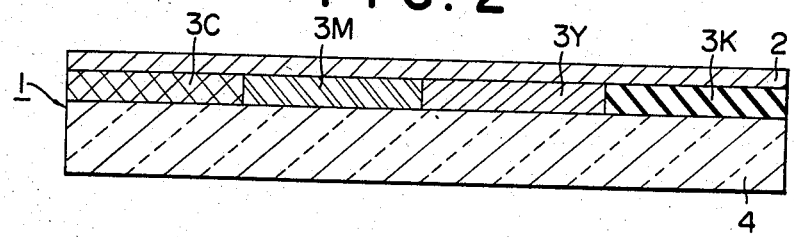
FIG. 2 is cross-sectional view taken along line II—II of FIG. 1.

As shown in FIG. 2, this chromatic proofreading film 1 is comprised of a base film 4, a non silver salt photosensitive layer 3C, 3M, 3Y and 3K divided up into the four regions dyed into the corresponding colors placed over the base film 4, and a silver halide photosensitive layer 2 placed over the non silver salt photosensitive layer 3.

As previously described, the color separated picture images are recorded in the corresponding regions of the chromatic proofreading film 1, for instance, by mounting this chromatic proofreading film onto a recording drum of a color scanner and processing the chromatic proofreading film 1 thereafter much in the same way as handling only one of the chromatic proofreading films of a conventional type. Obviously, the color scanner must be initially set up so that the four color separated picture images of the four colors fall upon the corresponding regions of the chromatic proofreading film mounted on the recording drum.

The arrangement of the regions of various colors is by no means limited to the above described embodiment but may well be other arrangements which suit the particular application.

Figure 3:
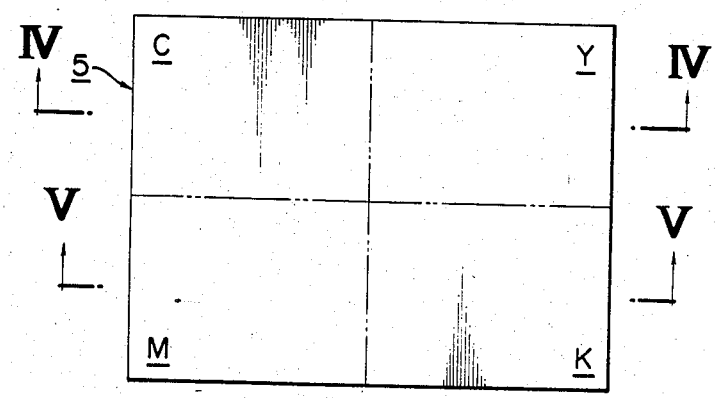
FIG. 3 is a plan view of another embodiment of the chromatic proofreading film according to this invention in which the regions of different colors are arranged in a rectangular two-by-two arrangement.
Figure 4:
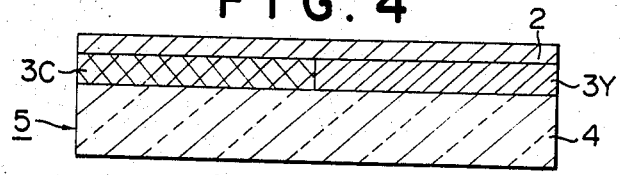
FIG. 4 is a cross-sectional view taken along line IV—IV of FIG. 3.
Figure 5:
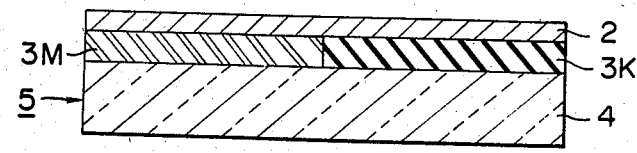
FIG. 5 is a cross-sectional view taken along line V—V of FIG. 3.

FIG. 3 shows another embodiment of the chromatic proofreading film 5 of this invention exemplifying such a concept of variation. In this embodiment, the four different regions of the non silver halide photosensitive layer 3 are distributed in a rectangular two-by-two arrangement. FIGS. 4 and 5 show the cross-sections of the chromatic proofreading film 5 of the second embodiment taken along two different lines.

The base film 4 may be a transparent or semi-transparent film sheet, for instance, made of plyester, polyethylene, polystylene etc., which is generally used as a support for a normal chromatic proofreading film meanwhile each of the non silver salt photosensitive layers 3C, 3M, 3Y and 3K may be a photosensitive layer, for instance, made of diazo or azide photosensitive resins or other materials which may be dyed to a desired color in advance and can be selectively removed with development liquid at their photographically exposed or unexposed part such as those commonly found in pre-dyed type chromatic proofreading films.

The silver halide photosensitive layer 2 may be prepared from commonly known silver halide photosensitive emulsion.

To coat the layer of the non silver salt photosensitive emulsion layer 3C, 3M, 3Y and 3K over the base film 4, it is possible to print the non silver salt photosensitive layer of each color in sequence through a printing process, to form the non silver salt photosensitive layer over necessary regions through the roll coat method after covering up the unnecessary regions with a mask in a sequential manner, or to dye the portions that are not covered by a dye mask to a desired color after forming a non silver salt photosensitive emulsion layer that is not dyed initially over the whole surface of the base film 4.

A transparent strip may be provided between the different regions of the non silver salt photosensitive layer of various colors.

As described above, the chromatic proofreading film 1 and 5 according to this invention is comprised of a base film 4, a non silver salt photosensitive layer 3 having, for instance, four regions dyed to the colors of cyan, magenta, yellow and black one next to another, and silver halide photosensitive layer 2 over the non silver salt photosensitive layer.

Therefore, as opposed to the case of a conventional chromatic proofreading film which consists of four sheets of base film each coated with a non silver salt photosensitive layer of a corresponding color and requires separate handling for the four sheets of chromatic proofreading film in each of the plate making process, the chromatic proofreading film of this invention may be handled as a single sheet of chromatic proofreading film in the processes of mounting it onto the recording drum of a color scanner and of photographic development until it is cut apart into four separate sheets carrying the picture images dyed to the colors of cyan, magenta, yellow and black with substantial savings in the amount of necessary work and time.

Furthermore, since no special photosensitive material is required and the photosensitive material for an ordinary chromatic proofreading film may be used, there is no loss in the picture quality as compared with those produced on conventional chromatic proofreading film.

Although the above description pertained to specific embodiments of this invention, it is obvious to a person skilled in the art that various modifications and replacements may be made without departing from the spirit of this invention.

For instance, the basic colors are assumed to be comprised of cyan, magenta, yellow and black in the above description, but may well be comprised of other colors and the number of the colors may not be necessarily four.

Also, the color scanner does not have to be a rotary drum type but may well be a planar type. Even a contact exposure device, a plate making camera or a device of other kind is also usable as long as it is capable of recording a picture image onto two or more regions as color separated picture images of the corresponding colors.

What is claimed is:

1. Film for simultaneous chromatic proofreading of color separated picture images of different basic colors comprising:
a transparent or opaque base film;
a non silver salt photo-sensitive layer consisting essentially of a diazo or azide photosenitive material and comprising two or more well defined regions placed at adjacent locations over the base film; and said regions being dyed to correspond to the different basic colors of said color separated picture images.
a silver halide photosensitive layer provided over the non silver salt photosensitive layer wherein said chromatic proofreading film can be used to simultaneously proofread color separated picture images of different colors.

2. Film for chromatic proofreading as defined in claim 1, wherein the basic colors are comprised of cyan, magenta, yellow and black.

3. Film for chromatic proofreading as defined in claim 1, wherein a transparent strip is provided between each two adjacent regions of the non silver salt photosensitive layer.

4. Film for chromatic proofreading as defined in claim 1, wherein the regions of the non silver salt photosensitive layer are arranged one next to another in row.

5. Film for chromatic proofreading as defined in claim 1, wherein the regions of the non silver salt photosensitive layer are arranged in a rectangular two-by-two formation.

* * * * *